United States Patent
Barbieri et al.

(10) Patent No.: US 9,660,594 B2
(45) Date of Patent: May 23, 2017

(54) RESONATING FILTER AND METHOD THEREOF

(71) Applicant: Freescale Semiconductor, Inc., Austin, TX (US)

(72) Inventors: Travis A. Barbieri, Phoenix, AZ (US); Basim H. Noori, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/293,278

(22) Filed: Jun. 2, 2014

(65) Prior Publication Data

US 2015/0349397 A1    Dec. 3, 2015

(51) Int. Cl.
*H01P 7/08* (2006.01)
*H03F 1/56* (2006.01)
(Continued)

(52) U.S. Cl.
CPC .............. *H03F 1/56* (2013.01); *H01P 1/2039* (2013.01); *H03F 1/565* (2013.01); *H03F 3/193* (2013.01); *H03F 3/601* (2013.01); *H03H 11/1213* (2013.01); *H03F 2200/165* (2013.01); *H03F 2200/171* (2013.01); *H03F 2200/255* (2013.01); *H03F 2200/387* (2013.01); *H03F 2200/451* (2013.01); *H03H 7/0123* (2013.01)

(58) Field of Classification Search
CPC .......... H01P 7/082; H01P 1/2039; H03F 1/56; H03F 1/565; H03F 3/193; H03F 3/601; H03H 11/1213
USPC ......................................................... 333/246
See application file for complete search history.

(56) References Cited

U.S. PATENT DOCUMENTS 5,321,375 A * 6/1994 Corman ..................... 333/246
6,452,465 B1 * 9/2002 Brown et al. ............... 333/205
(Continued)

FOREIGN PATENT DOCUMENTS

| EP | 0625823 A1 | 11/1994 |
| EP | 0700152 A1 | 3/1996 |
| EP | 1848107 A2 | 10/2007 |

OTHER PUBLICATIONS

Ingruber et al., "High Efficiency Harmonic Control Amplifier," Vienna University of Technology, IEEE MTT-S Digest, pp. 859-862, 1996 (4 pages).

(Continued)

*Primary Examiner* — Stephen E Jones
*Assistant Examiner* — Scott S Outten (57) ABSTRACT

In general the embodiments described herein can provide alternating-current (AC) resonating filters. These resonating filters comprise a transmission line, a first resonator, and a second resonator. The first resonator is configured to block AC signals in a first frequency range, while the second resonator is configured to block AC signals in a second frequency range, where the second frequency range is higher than the first frequency range. The transmission line has a first node coupled to an AC source, and the first resonator is coupled to the transmission line a first distance from the first node, and the second resonator is coupled to the transmission line a second distance from the first node, where the second distance is greater than the first distance. When so configured the resonating filter can effectively block signals in multiple selected frequency bandwidths.

20 Claims, 7 Drawing Sheets

(51) Int. Cl.
*H03F 3/193* (2006.01)
*H01P 1/203* (2006.01)
*H03H 11/12* (2006.01)
*H03F 3/60* (2006.01)
*H03H 7/01* (2006.01)

(56) References Cited

U.S. PATENT DOCUMENTS

2007/0247231 A1 10/2007 Allen et al.
2008/0129411 A1* 6/2008 Beaudin .............. H03H 9/542
 333/133
2013/0001662 A1* 1/2013 Nishijima .................... 257/296

OTHER PUBLICATIONS

Syrett, B.A., "A Broad-Band Element for Microstrip Bias or Tuning Circuits," IEEE Transactions on Microwave Theory and Techniques, vol. MTT-28, No. 8, pp. 925-927, Aug. 1980 (3 pages).

* cited by examiner

RESONATING FILTER AND METHOD THEREOF

TECHNICAL FIELD

Embodiments of the subject matter described herein relate generally to electronic devices, and more particularly to couplers used in radio frequency (RF) semiconductor applications.

BACKGROUND

Radio frequency systems commonly employ filters in various applications. For example, resonating filters are used in the DC biasing of RF power amplifiers to prevent RF signals from propagating toward the DC bias sources where the RF energy would be wasted.

To improve the performance of such RF amplifiers, it is generally desirable to position these resonating filters as close to the RF amplifier as possible, as this can reduce the impedances between the RF amplifier and the RF resonating filter. Additionally, it is generally desirable to precisely tune the RF resonating filter to effectively block one or more specific frequencies. For example, it is generally desirable to block the main RF operational frequency of interest and one or more harmonics from propagating to the DC bias source. When an RF amplifier is properly configured with such RF resonating filters blocking the propagation of RF signals toward the DC bias sources, the overall bandwidth and performance of the RF amplifier can be improved.

Unfortunately, previous RF resonating filters implementations have had limited ability to achieve the bandwidth and precise frequency tuning needed effectively block multiple frequencies. For example, previous RF resonating frequencies have been limited in ability to block both the main RF operational frequency of an RF amplifier and one or more harmonics. For this and other reasons there remains a continuing need for improved resonating filters.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The embodiments described herein can provide semiconductor devices with improved performance. Embodiments include resonating filters used in a variety of applications, including radio frequency (RF) applications. In general, filters are devices that are designed to pass some types of signals while blocking other types of signals. As an example, some filters are designed to block a particular range of frequencies while allowing signals of other frequency to pass.

In RF applications, filters are used in a variety of different functions. For example, resonating filters are commonly used in RF power amplification. As one specific example, resonating filters are used in biasing circuits of RF power amplifiers to prevent the RF signals of interest from propagating toward the DC bias sources where the RF energy would be wasted.

In general, the embodiments described herein can provide improved filtering. As such, these embodiments can improve the performance of amplifiers and other devices that utilize resonating filters. In one embodiment, an alternating-current (AC) resonating filter is provided. The resonating filter includes a transmission line, a first resonator, and a second resonator. The first resonator is configured to block AC signals in a first frequency range, while the second resonator is configured to block AC signals in a second frequency range, where the second frequency range is higher than the first frequency range (although it should be noted that the first and second frequency ranges could partially overlap in some embodiments). The transmission line has a first node coupled to an AC source, and the first resonator is coupled to the transmission line a first distance from the first node, and the second resonator is coupled to the transmission line a second distance from the first node, where the second distance is greater than the first distance. When so configured, the resonating filter can effectively block signals in multiple selected frequency bandwidths.

Figure 1:
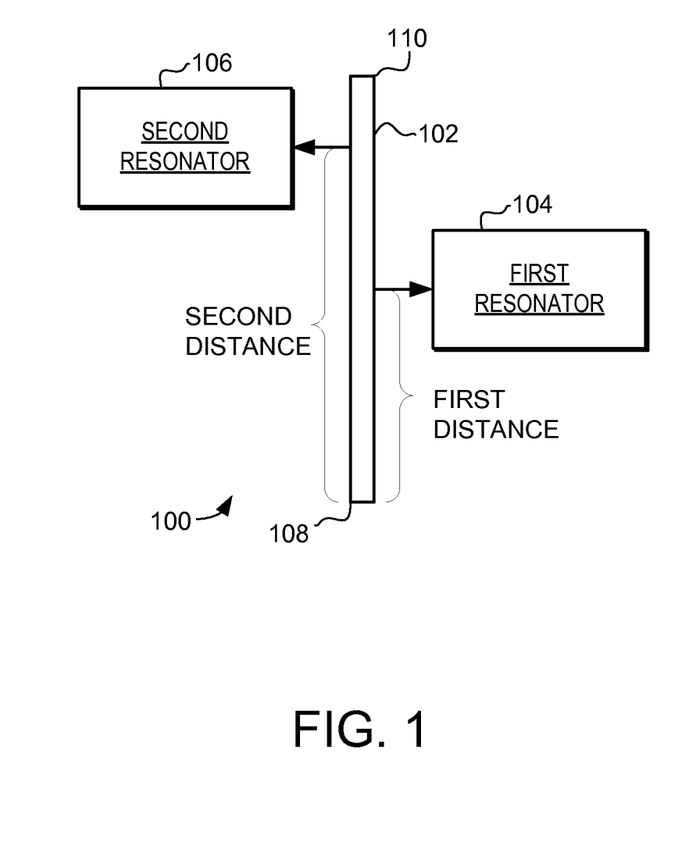
FIG. 1 is a schematic diagram of a resonating filter in accordance with an example embodiment.

FIG. 1 illustrates an exemplary resonating filter 100. The resonating filter 100 includes a transmission line 102, a first resonator 104, and a second resonator 106. The first resonator 104 is configured to block AC signals in a first frequency range, while the second resonator 106 is configured to block AC signals in a second frequency range. As will be described in greater detail below, the first resonator 104 and the second resonator 106 are implemented such that the second frequency range is higher than the first frequency range.

The transmission line 102 has a first node 108 and a second node 110. When implemented, the first node 108 is coupled to an AC source, such as the input or output of an RF amplifier. In some implementations, the second node 110 is coupled to a DC source, such as a DC bias voltage. Examples of such an implementation will be discussed in greater detail below.

The first resonator 104 is coupled to the transmission line 102 a first distance from the first node 108. Likewise, the second resonator 106 is coupled to the transmission line 102 a second distance from the first node 108, where the second distance is greater than the first distance. When properly configured, the resonating filter can effectively block signals in multiple different frequency bandwidths. Specifically, coupling the higher frequency range resonator (i.e., second resonator 106) a farther distance from the first node 108 compared to the lower frequency range resonator (i.e., first resonator 104) facilitates independent control of the impedances presented to the first node 108 at multiple different frequencies. Furthermore, this independent control of impedances can provide relatively high reflection coefficients at the first node 108 for each of the multiple different frequencies. These high reflection coefficients allow the resonating filter 100 to effectively block signals in each of the multiple frequency bandwidths. Furthermore, in some applications these higher reflection coefficients can increase the overall performance of an associated device, such as increasing the usable bandwidth of an RF amplifier when the resonating filter 100 is used in DC biasing of the RF amplifier.

As noted above, coupling the higher frequency range resonator (i.e., second resonator 106) a farther distance from the first node 108 compared to the lower frequency range resonator (i.e., first resonator 104) facilitates independent control of the impedances seen at both a higher and lower frequencies. Specifically, the distance between the first node 108 and the second resonator 106 (i.e., the second distance) can be changed without also affecting the impedance at the lower frequency range. This impedance at the higher frequency range can be optimized by changing the second distance without affecting the impedance at the lower frequency range. Thus, by selecting the appropriate first resonator 104, second resonator 106, first distance and second distance the impedances at both the higher and lower frequencies can be optimized.

It should be noted that such optimization of multiple impedances is not possible with a design in which the higher frequency range resonator is closer to the first node 108 than the lower frequency range resonator. Instead, when the higher frequency range resonator is closer to the first node, any change in the position of the higher frequency range resonator will cause both a change in both the impedance at the higher frequency range and the lower frequency range. This is due at least in part to the fact that such a change will also change the effective electrical length between the first node 108 and the lower frequency range resonator.

As one example, assume that the resonating filter 100 is to be configured to provide impedances at the first node 108 that will substantially block RF signals at both a fundamental frequency (f0) and a higher $2^{nd}$ harmonic frequency (2f0). Using the embodiments described herein, the first resonator 104 can be configured for the resonating filter 100 to achieve the first desired impedance at f0 and the second resonator 106 can be configured for the resonating filter 100 to achieve a second desired impedance at 2f0. Specifically, such configurations can occur by selecting the appropriate first resonator 104, second resonator 106, first distance and second distance to optimize the resonating filter 100 to provide the first desired impedance at f0 and the second desired impedance at 20. Specifically, after determining the design of the first resonator 104 and the first distance to provide the first desired impedance at f0, the second resonator 106 and the second distance can be determined to provide the second desired impedance at 20 without substantially affecting the impedance at f0.

It should be noted that the relative location of the first resonator 104 and second resonator 106 means that the second resonator 106 isolates the isolation of the first resonator 104. This "isolation of the isolation" results in higher overall isolation across the bandwidth of the filter.

The first resonator 104 and the second resonator 106 can be implemented using a variety of structures and devices. In general, the first resonator 104 and second resonator 106 include an inductance and capacitance that provide complex impedances that change with frequency. At the 'resonant frequency' such resonators have equal but opposite imaginary impedances that cancel each other out and pass all signals with that frequency. As one example, the first resonator 104 and the second resonator 106 can each be implemented with radial stubs. In such an embodiment, the first resonator 104 would be implemented with a radial stub configured to block signals in a relatively high frequency range and would be coupled to transmission line 102 a relatively farther distance from the first node 108. Likewise, the second resonator 106 would be implemented with a radial stub configured to block signals in a relatively low frequency range and would be coupled to the transmission line 102 a relatively shorter distance from the first node 108.

In general, "stubs" include transmission lines that are only connected at one end, with the free end left as an open-circuit and/or short-circuit. As such, stubs have substantially reactive input impedance that can be considered to approximate frequency-dependent capacitors and/or inductors with some resistance due to imperfect conductance. In a properly tuned stub, the termination opposite the input has no effect on the input impedance because substantially all the power is being reflected back. Thus, stub can be implemented with an open, short, matched load, or any combinations thereof.

Radial stubs are effectively a collection of stubs, with the stubs radially arranged such that each stub is at a different angle. In such radial stubs, the individual stubs at different angles effect different frequency bandwidths. Thus, the overall radial stub includes a resonator with a frequency bandwidth determined by the number and radial arrangement of the stubs. The frequency bandwidth that is impacted by the radial stub is a function of the stub radius with a shorter radius impacting higher frequencies. Thus, smaller radial stubs correspond to higher frequency bandwidths, and larger radial stubs correspond to lower frequency bandwidths.

Radial subs are just one example implementation of the first resonator 104 and the second resonator 106, and other implementations are possible. For example, the first resonator 104 and the second resonator 106 can be implemented with lumped elements (e.g., inductors and capacitors), open/short stub transmission lines, or combinations of both.

The transmission line 102 can be implemented with a variety of different structures. As one example, the transmission line 102 can be implemented as a microstrip formed on a semiconductor structure. In general, microstrips are transmission lines that are fabricated on printed circuit boards. A typical microstrip includes a conducting strip separated from a ground plane by the printed circuit board dielectric layer. Other examples include waveguides and striplines.

As described above, the first resonator 104 is coupled to the transmission line 102 a first distance from the first node 108, and the second resonator 106 is coupled to the transmission line 102 a second distance from the first node 108, where the second distance is greater than the first distance. In a typical embodiment, the first distance and second distance would be determined based on the frequency ranges that are to be blocked by the resonating filter 100. For example, the first distance can be set at any ¼ wavelength multiple of the center frequency to be blocked by the first resonator 104. At ¼ wavelength multiples the first resonator 104 will present at either a short circuit or open circuit at the center frequency. As some examples, at ½ or 1 times the wavelength the first resonator 104 will present as an open circuit at the center frequency. In contrast, at ¼ or ¾ times the wavelength the first resonator 104 will present as a short circuit at the center frequency.

Likewise, the second distance can be initially set at a ¼ wavelength multiples of the center frequency to be blocked by the second resonator 106, and as discussed above, this distance can be changed without also affecting the impedance at the lower frequency range.

Figure 2A:
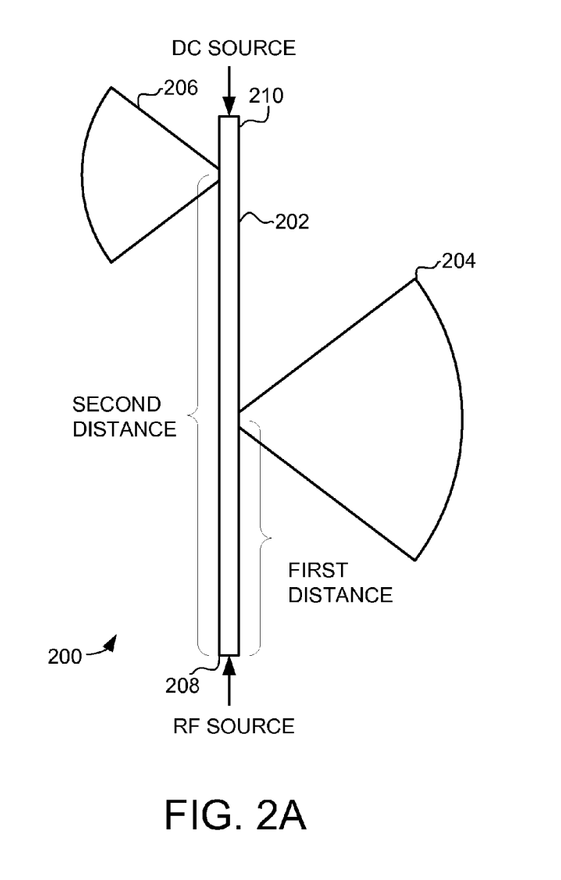
FIGS. 2A-2B are a schematic view of a resonating filter and associated Smith chart in accordance with example embodiments.
Figure 2B:
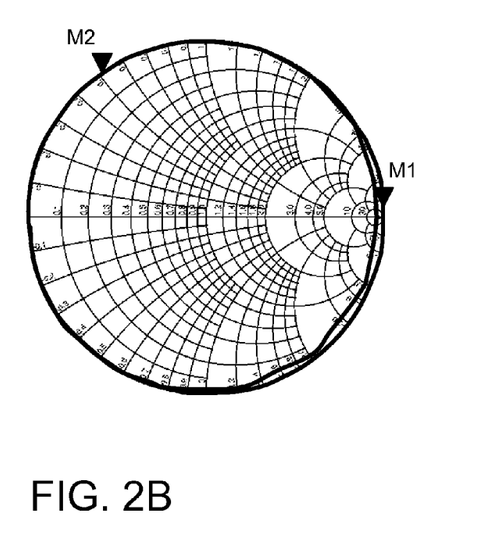

FIGS. 2A and 2B illustrate an embodiment of a resonating filter 200 and a corresponding Smith Chart 250 for the resonating filter 200. The resonating filter 200 includes a transmission line 202, a first resonator 204, and a second resonator 206. In this illustrated embodiment the first resonator 204 and the second resonator 206 are both radial stubs. The first resonator 204 is configured to block AC signals in a first frequency range, while the second resonator 206 is configured to block AC signals in a second frequency range. In this case the second resonator 206 is physically smaller than the first resonator 204 and thus the second frequency range is higher than the first frequency range. The transmission line 202 has a first node 208 and a second node 210. The first resonator 204 is coupled to the transmission line 202 a first distance from the first node 208. Likewise, the second resonator 206 is coupled to the transmission line 202 a second distance from the first node 208, where the second distance is greater than the first distance.

In this illustrated embodiment, the first node 208 is coupled to an RF source, while the second node 210 is coupled to the DC source. So configured, the resonating filter 200 can allow a bias voltage from the DC source to pass from the second node 210 to the first node 208, while blocking selected AC signals from passing from the first node 208 to the second node 210.

As illustrated in the Smith chart 250 of FIG. 2B, the resonating filter 200 can provide a reflection coefficient at the first node 208 that is near unity for multiple frequencies of interest. In general, a reflection coefficient describes the amplitude of a reflected wave relative to that of the incident wave. Thus, a reflection coefficient near unity indicates that substantially no energy is propagating past the node at those frequencies. In Smith chart 250, the markers M1 and M2 correspond to the frequencies that first resonator 204 and the second resonator 206 are respectively tuned for. Furthermore, the markers M1 and M2 correspond to the complex impedances presented to the first node 208 as a result of the configuration of first resonator 204 and second resonator 206. Specifically, the marker M1 corresponds to the impedance at a relatively low frequency range, while marker M2 corresponds to the impedance at a relatively high frequency range. The location of the markers M1 and M2 near the edge of the Smith chart 250 indicates that the reflection coefficient is near unity for both the low and high frequencies, and that as a result substantially all of the energy at those frequencies will be reflected back by the resonating filter 200.

Figure 3A:
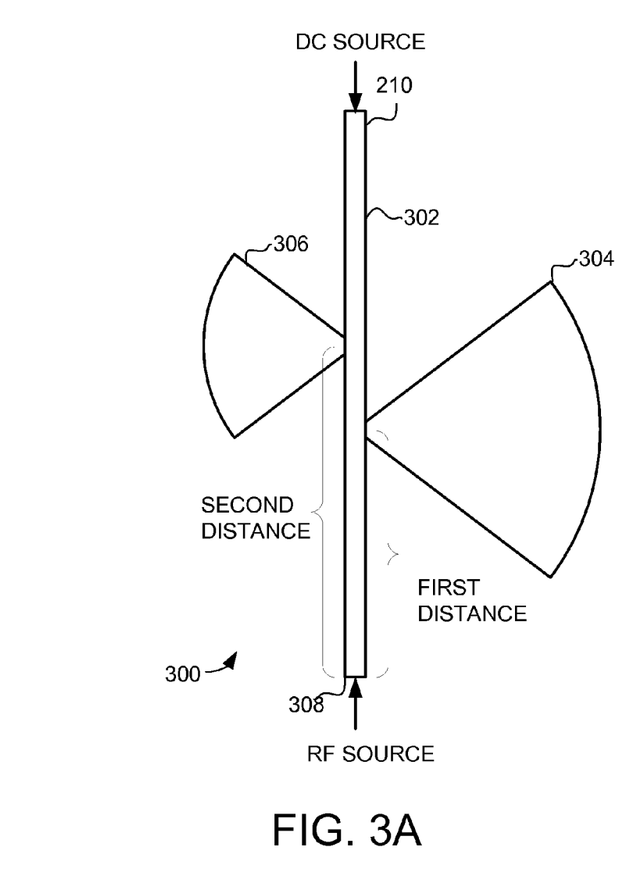
FIGS. 3A-3B are a schematic view of a resonating filter and associated Smith chart in accordance with example embodiments.
Figure 3B:
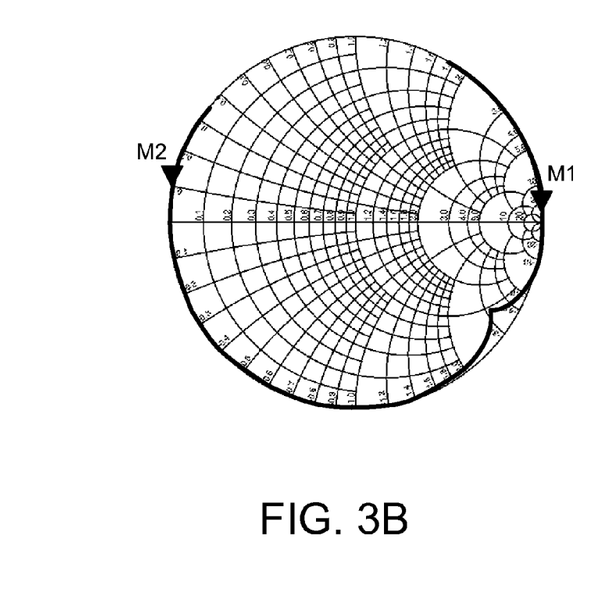

FIGS. 3A and 3B illustrate another embodiment of a resonating filter 300 and a corresponding Smith Chart 350 for the resonating filter 300. Again, the resonating filter 300 includes a transmission line 302, a first resonator 304, and a second resonator 306, and again first resonator 304 and the second resonator 306 are both radial stubs. Like the resonating filter 200, the first resonator 304 is configured to block AC signals in a first frequency range, while the second resonator 306 is configured to block AC signals in a second frequency range. However, in this illustrated example the second resonator 306 is relatively closer to the first node 308, and thus the second distance is less than that of resonating filter 200.

The Smith chart 350 again shows markers M1 and M2 that correspond to the complex impedances presented to the first node 308, with marker M1 corresponding to the impedance at a relatively low frequency range and marker M2 corresponding to the impedance at a relatively high frequency range. In this case, the shortening of the second distance has resulted in a change in the position of marker M2, while the position of outermost marker (in this case marker M1) is substantially unaffected. This change in position of marker M2 with marker M1 remaining in substantially the same position shows that the impedance presented to the first node 308 at the higher frequency range has changed, while the impedance to presented at the lower frequency range has not. Thus, the distance between the first node 308 and the second resonator 306 can be changed without also affecting the impedance at the lower frequency range. This allows the impedance at the higher frequency range to be optimized by changing the second distance without affecting the impedance at the lower frequency range. And again, the locations of the markers M1 and M2 near the edge of the Smith chart 350 indicate that the reflection coefficient is near unity for both the low and high frequencies, and that as a result substantially all of the energy at those frequencies will be reflected back by the resonating filter 300.

Stated another way, changing the position of the second resonator 306 in this example changes phase of the reflection coefficient at the higher frequency but the phase and magnitude of the lower frequency remain constant. Thus, a designer can provide an open circuit at the fundamental frequency and a short circuit at the second harmonic by providing a reflection coefficient with a magnitude at unity for both cases but with a phase difference of 180 degrees. In other embodiments other combinations of phase and impedance could be provided.

Figure 4:
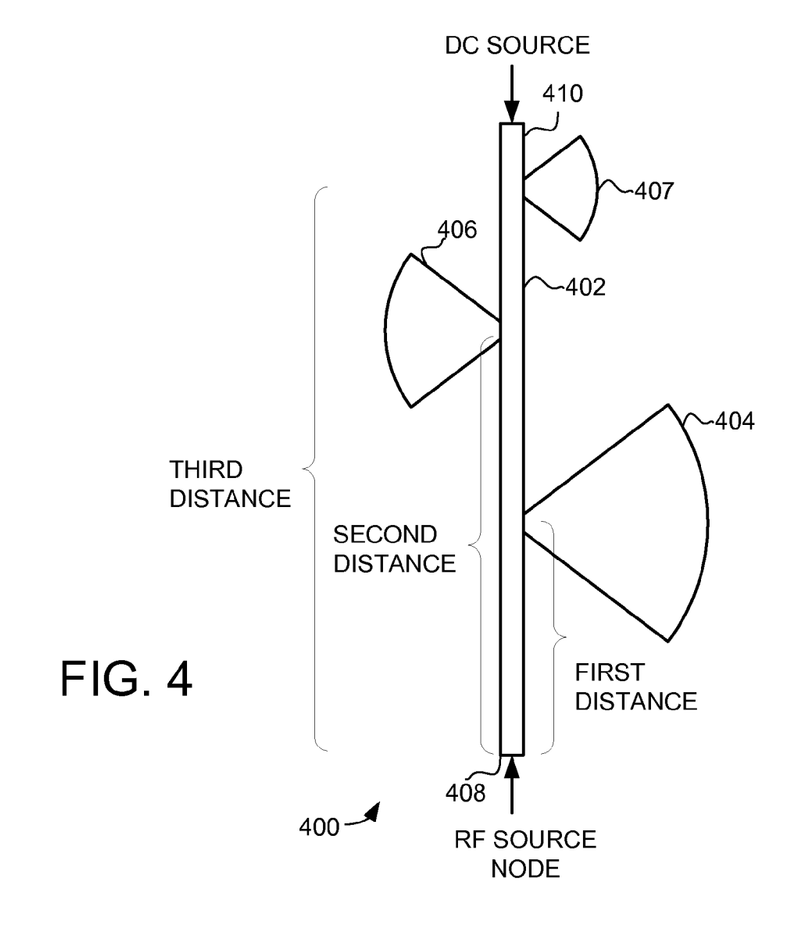
FIG. 4 is a schematic diagram of a resonating filter in accordance with an another example embodiment.

It should be noted while the examples illustrated in FIGS. 1-3 illustrate resonating filters with only two resonators, that this is just one example, and that the embodiments described herein can also be applied to devices with more resonators. In such embodiments, additional resonators can be added to block signals in additional frequency ranges. FIG. 4 illustrates an embodiment of a resonating filter 400 that includes three resonators. Specifically, the resonating filter 400 includes a transmission line 402, a first resonator 404, a second resonator 406 and a third resonator 407. In this illustrated embodiment, the first resonator 404, second resonator 406 and third resonator 407 are each radial stubs. The first resonator 404 is configured to block AC signals in a first frequency range, the second resonator 406 is configured to block AC signals in a second frequency range, and the third resonator 407 is configured to block AC signals in a third frequency range. In this case, the relative size of the resonators is such that the third frequency range is higher than the second frequency range, while the second frequency range is higher than the first frequency range. The transmission line 402 has a first node 408 and a second node 410. The first resonator 404 is coupled to the transmission line 402 a first distance from the first node 408. Likewise, the second resonator 406 is coupled to the transmission line 402 a second distance from the first node 408, where the second distance is greater than the first distance. Finally, the third resonator 407 is coupled to the transmission line 402 a third distance from the first node 408, where the third distance is greater than the second distance.

When so implemented, the resonating filter 400 can be configured to effectively block signals in three different frequency bandwidths. Specifically, the coupling of the middle frequency range resonator (i.e., second resonator 406) a farther distance from the first node 408 compared to the lower frequency range resonator (i.e., first resonator 404) allows the second distance to be changed without also affecting the impedance at the lower frequency range. Thus, the impedance at the middle frequency range can be optimized by changing the second distance without affecting the impedance at the lower frequency range.

Furthermore, coupling the highest frequency range resonator (i.e., third resonator 407) a greater distance from the first node 408 compared to the lower frequency range resonators (i.e., first resonator 404 and second resonator 406) facilitates independent control of the impedance presented to the first node 408 at the higher frequency range. Thus, the distance between the first node 408 and the third resonator 407 (i.e., the third distance) can be changed without also affecting the impedance at the two lower frequency ranges. Thus, again the impedance at the higher frequency range can be optimized by changing the third distance without affecting the impedance at the lower frequency ranges. The impedances at three different frequency ranges can thus be independently optimized in the resonating filter 400.

Figure 5A:
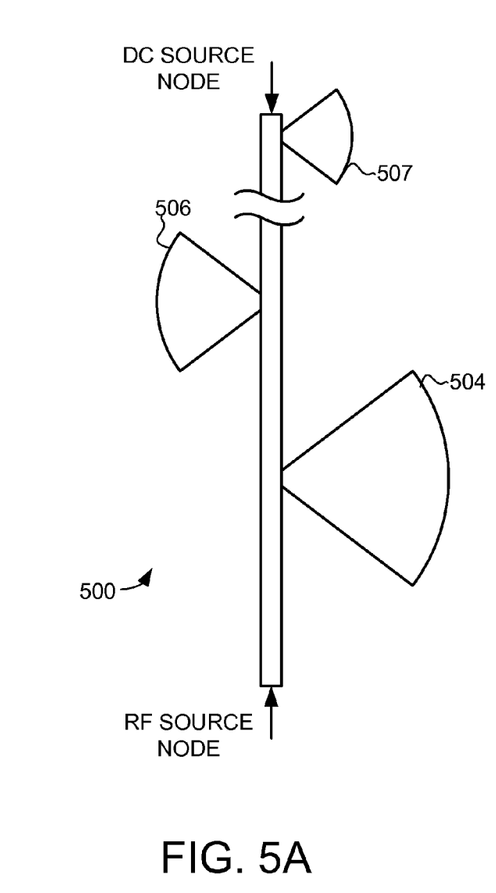
FIGS. 5A and 5B are schematic diagram and circuit representation of a resonating filter in accordance with an another example embodiment.
Figure 5B:
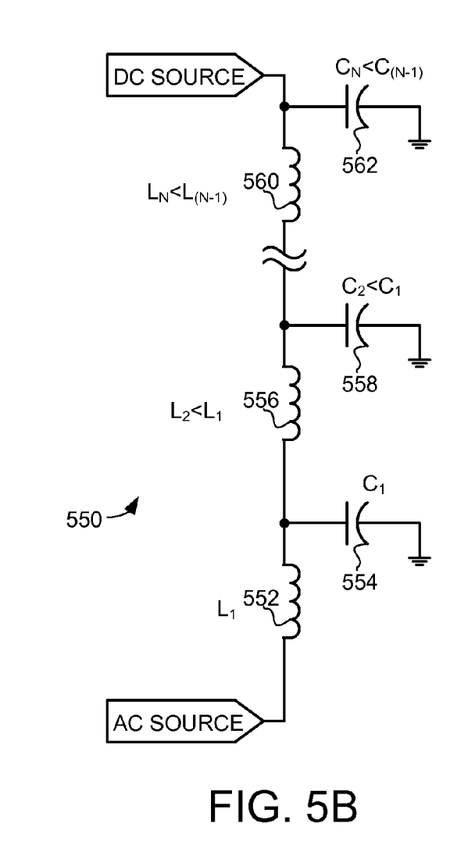

Again, additional resonators can be added for additional frequency ranges. FIGS. 5A and 5B illustrate example resonating filters that include additional resonators to block signals in additional frequency ranges. FIG. 5A illustrates such a resonating filter 500 schematically, while FIG. 5B illustrates a lumped element representation of such a resonating filter 550. Specifically, resonating filter 500 in FIG. 5A includes a first resonator 504, a second resonator 506, and an $n^{th}$ resonator 507. In each case, the resonators are arranged with the relatively higher frequency range resonators farther from the RF input source then the relatively low frequency range resonators. Thus, the $n^{th}$ resonator 507 would correspond to the highest frequency range that is to be filtered by the resonating filter 500, and is arranged the farthest distance from the RF source node. Likewise, the $(n-1)^{th}$ resonator would correspond to the next highest frequency range that is to be filtered by the resonating filter 500 and is arranged the next farthest distance from the RF source node. Such a resonating filter 500 can be expanded to include any number n of resonators.

Likewise, resonating filter 550 in FIG. 5B includes inductors 552, 556, and 560, and capacitors 554, 558 and 562. The inductor 552 and capacitor 554 represent the first resonator, the inductor 556 and capacitor 558 represent the second resonator, and the inductor 560 and capacitor 562 represent the $n^{th}$ resonator. Again, the resonators are arranged with the relatively higher frequency range resonators farther from the RF input source then the relatively low frequency range resonators, and again such a resonating filter 550 can be expanded to include any number n of resonators. In such an example, the size of the resonators would again be a function of their corresponding center frequency. Specifically, the capacitances will be smaller and the inductances will be larger as the frequency increases.

The resonating filters described above with reference to FIGS. 1-5 can be used in a variety of applications. For example, such resonating filters can be used in a variety of RF power amplification. As one specific example, the resonating filters illustrated in FIGS. 1-5 can be used in the biasing circuits of RF power amplifiers to prevent the RF signals of interest from propagating toward the DC bias sources where the RF energy would be wasted.

Figure 6:
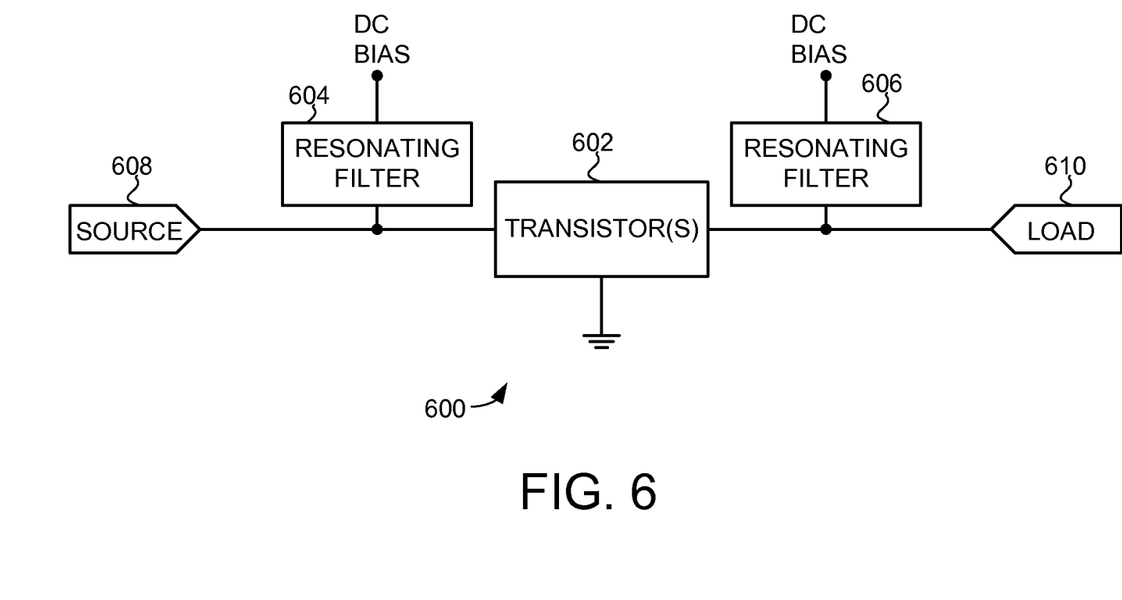
FIG. 6 is a schematic diagram of an amplifier in accordance with another example embodiment.

FIG. 6 illustrates an exemplary RF power amplifier 600. The amplifier 600 includes transistor(s) 602, resonating filters 604 and 606, a source 608, and a load 610. The transistor(s) 602 can include one or more or any suitable type of transistor. In some embodiments, the transistor 602 can include a large high power transistor. In other embodiments, the transistor(s) 602 can include a chain of multiple transistors arranged together in a way that provides high power capability.

The RF power amplifier 600 receives a RF signal at the source 608 and provides an amplified RF signal to the load 610. DC biases are applied to both the input and the output of the transistor(s) 602. In general, these DC biases are configured to bias the input and output of the transistor at the correct voltage level for efficient operation.

In accordance with the embodiments described herein, the DC biases are applied to the transistor(s) 602 through resonating filters 604 and 606. The resonating filters 604 and 606 are configured to allow the DC bias voltage from a DC source to pass to the transistors 602, while blocking selected frequency ranges of RF signals from propagating toward DC bias sources. To achieve high performance, it is generally desirable to couple the DC bias sources as physically close as possible to the transistors(s) 602. Additionally, it is also generally desirable to provide relatively high reflection coefficients at the multiple frequency ranges that are to be blocked from propagating toward the DC bias sources. Specifically, providing high reflection coefficients allows the resonating filters 604 and 606 to substantially block signals at both the fundamental RF frequency and one or more harmonic frequencies. This can increase the usable bandwidth and overall performance of the amplifier 600.

As one specific example, the resonating filters 604 and 606 can be configured to provide impedances that will substantially block RF signals at both a fundamental frequency (f0) and a higher $2^{nd}$ harmonic frequency (2f0). As was described above, the resonating filters 604 and 606 can be so configured by selecting the appropriate first resonator and second resonator, and by selecting the appropriate first distance and second distance to those resonators. Coupling the higher frequency range resonator (i.e., the second resonator) a farther distance from the input compared to the lower frequency range resonator (i.e., first resonator) facilitates independent control of the impedances seen at both the higher frequency range. Thus, the second distance can be changed to configure the impedance at the higher frequency range without also affecting the impedance at the lower frequency range. Thus, by first determining the design of the first resonator and the first distance to provide the first desired impedance at f0, the second resonator 106 and the second distance can then be determined to provide the second desired impedance at 2f0. This allows the resonating filters 604 and 606 to provide impedances that will substantially block RF signals at both the fundamental frequency (f0) and the higher $2^{nd}$ harmonic frequency (2f0). And again this can increase the usable bandwidth and overall performance of the amplifier 600.

In one example, the resonating filters 604 and 606 can be designed to have impedance that is substantially "open" at the fundamental frequency (f0), and to have impedance that is substantially a "short" at the $2^{nd}$ harmonic frequency (2f0). In other examples the resonating filters 604 and 606 are designed to have an open impedance at the fundamental frequency (f0) but to also have an intermediate impedance (between open and short) at the $2^{nd}$ harmonic frequency (2f0). Finally, in third examples the resonating filters 604 and 606 are designed to have open impedance at the fundamental frequency (f0) and to also have open impedance at the $2^{nd}$ harmonic frequency (2f0). In each of these three examples the embodiments described herein facilitate independent control of the impedances, and thus can be used to provide the desired impedance at the $2^{nd}$ harmonic frequency (2f0)

Configuring the resonating filters 604 and 606 to have a short impedance at the 2nd harmonic frequency (2f0) may be desirable for applications where the impedance of a power supply (e.g., a high frequency DC power supply) is not known. In such a case, the short circuit at the harmonic frequency can provide a more reliable termination to the power supply. And again, the embodiments described herein can provide a resonating filter that be tuned to provide the desired short circuit impedance at the harmonic frequency independent of the fundamental frequency impedance provided by the first resonator.

Figure 7:
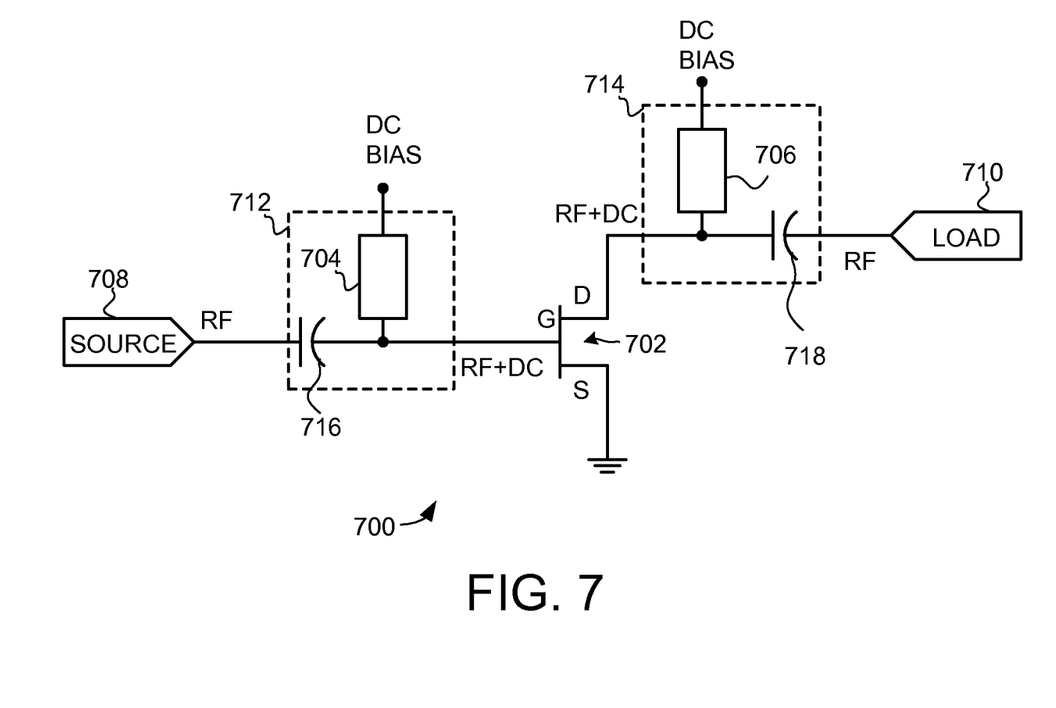
FIG. 7 is a schematic diagram of an amplifier in accordance with an example embodiment.

FIG. 7 illustrates another embodiment of an exemplary RF power amplifier 700. The amplifier 700 includes a transistor 702, resonating filters 704 and 706, capacitors 716 and 718, a source 708, and a load 710. In this embodiment, resonating filters 704 and 706 and capacitors 716 and 718 are arranged in a bias tee configuration. Specifically, first bias tee 712 includes the resonating filter 704 and capacitor 716, and second bias tee 714 includes the resonating filter 706 and capacitor 718. In general, a bias tees 712 and 714 are three port networks that can be used to set the DC bias of electronic components without disturbing other components. The bias tees 712 and 714 include a low frequency input that is used to set the DC bias, a high frequency input that passes RF signals but blocks the DC biasing levels, and an output that sees both the DC bias and the RF signals. In this embodiment, the transistor 702 includes a high power field effect transistor (FET), and the source 708 is coupled to the transistor gate and the load is coupled to the transistor drain. The first bias tee 712 is coupled to the gate to provide a DC bias to the gate. The second bias tee 714 is coupled to the drain to provide a DC bias to the drain.

In general, a bias tee configuration uses a resonating filter to block AC signals and uses a capacitor to block DC signals. Thus, RF signals are prevented from propagating to the DC bias sources and RF signals are prevented from propagating to the source 708 and load 710. However, both the RF signal and the DC bias are applied to the gate of the transistor 702, and both the RF signal and DC bias are present at the drain of the transistor 702. This allows the transistor to be biased for efficient operation and the RF signal to be amplified and applied to the load 710.

In accordance with the embodiments described herein, the resonating filters 704 and 706 are configured to substantially block RF signals in multiple frequency bands to increase the bandwidth and performance of the amplifier 700. As was described above, the resonating filters 704 and 706 can be so configured by selecting the appropriate first resonator and second resonator, and by selecting the appropriate first distance and second distance to those resonators. Coupling the higher frequency range resonator a farther distance from the input compared to the lower frequency range resonator facilitates independent control of the impedances seen at both the higher and lower frequency ranges. This allows the resonating filters 704 and 706 to provide impedances that will substantially block RF signals at both the higher and lower frequency range. Again, this can increase the usable bandwidth and overall performance of the amplifier 700. Specifically, in some embodiments the amplifier 700 can be provided with higher isolation for frequency bands of interest and thus provide the ability to utilize more of the available bandwidth of the amplifier 700.

In one embodiment, an alternating-current (AC) resonating filter is provided that includes: a transmission line having a first node coupled to an AC source; a first resonator coupled to the transmission line a first distance from the first node, the first resonator configured to block AC signals in a first frequency range; a second resonator coupled to the transmission line a second distance from the first node, where the second distance is greater than the first distance, the second resonator configured to block AC signals in a second frequency range, and wherein the second frequency range is a higher than the first frequency range.

In another embodiment, a bias tee for biasing a radio frequency (RF) device is provided, the bias tee comprising: a direct current (DC) source; a transmission line having a first node coupled to the RF device and a second node coupled to the DC source; a first resonator coupled to the transmission line a first distance from the first node, the first resonator configured to block RF signals in a first frequency range; a second resonator coupled to the transmission line a second distance from the first node, where the second distance is greater than the first distance, the second resonator configured to block RF signals in a second frequency range, and wherein the second frequency range is a higher than the first frequency range; and a capacitor coupled to the first node.

In another embodiment, a radio frequency (RF) amplifier is provided. In this embodiment the RF amplifier includes: a first transistor having a first transistor input and a first transistor output; a first bias tee coupled to first transistor input, the first bias tee comprising: a first direct current (DC) source: a first transmission line having a first node coupled to the first transistor input and a second node coupled to the first DC source; a first resonator coupled to the first transmission line a first distance from the first node, the first resonator configured to block RF signals in a first frequency range; a second resonator coupled to the first transmission line a second distance from the first node, where the second distance is greater than the first distance, the second resonator configured to block RF signals in a second frequency range, and wherein the second frequency range is a higher than the first frequency range; and a first capacitor coupled to the first node; and; second bias tee coupled to first transistor output, the second bias tee comprising: a second direct current (DC) source: a second transmission line having a third node coupled to the first transistor output and a fourth node coupled to the second DC source; a third resonator coupled to the second transmission line a third distance from the third node, the third resonator configured to block RF signals in a third frequency range; a fourth resonator coupled to the second transmission line a fourth distance from the third node, where the fourth distance is greater than the third distance, the fourth resonator configured to block RF signals in a fourth frequency range, and wherein the fourth frequency range is a higher than the third frequency range; and a second capacitor coupled to the third node.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict several exemplary arrangements of elements, additional intervening elements, devices, features, or components may be present in other embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An alternating-current (AC) resonating filter comprising:
    a transmission line having a first node coupled to an AC source;
    a first resonator coupled to the transmission line a first distance from the first node, the first resonator configured to block AC signals in a fixed first frequency range; and
    a second resonator coupled to the transmission line a second distance from the first node, where the second distance is greater than the first distance, the second resonator configured to block AC signals in a fixed second frequency range, and wherein the second frequency range is higher than the first frequency range and wherein the second frequency range is non-overlapping with the first frequency range.

2. The AC resonating filter of claim 1, wherein the first distance is a ¼ wavelength multiple of a first center frequency in the first frequency range.

3. The AC resonating filter of claim 2, wherein the second distance is a ¼ wavelength multiple of a second center frequency in the second frequency range.

4. The AC resonating filter of claim 2, wherein the second distance is configured to provide an open circuit impedance at a second center frequency in the second frequency range.

5. The AC resonating filter of claim 1, further comprising a third resonator coupled to the transmission line a third distance from the first node, where the third distance is greater than the second distance, the third resonator configured to block RF signals in a third frequency range, and wherein the third frequency range is a higher than the second frequency range.

6. The AC resonating filter of claim 5, wherein the third resonator comprises a third radial stub, and wherein the first radial stub has a first radius, the second radial stub has a second radius, and the third radial stub has a third radius, and wherein the first radius is larger than the second radius, and the second radius is larger than the third radius.

7. The AC resonating filter of claim 1, wherein the first resonator comprises a first radial stub, and wherein the second resonator comprises a second radial stub, and wherein the first radial stub has a first radius, and the second radial stub has a second radius, and wherein the first radius is larger than the second radius.

8. The AC resonating filter of claim 1, wherein the transmission line comprises a microstrip.

9. A bias tee for biasing a radio frequency (RF) device, the bias tee comprising:
    a direct current (DC) source:
    a transmission line having a first node coupled to the RF device and a second node coupled to the DC source;
    a first resonator coupled to the transmission line a first distance from the first node, the first resonator configured to block RF signals in a fixed first frequency range;
    a second resonator coupled to the transmission line a second distance from the first node, where the second distance is greater than the first distance, the second resonator configured to block RF signals in a fixed second frequency range, and wherein the second frequency range is higher than the first frequency range and wherein the second frequency range is non-overlapping with the first frequency range; and
    a capacitor coupled to the first node.

10. The bias tee of claim 9, wherein the first distance is a ¼ wavelength multiple of a first center frequency in the first frequency range.

11. The bias tee of claim 10, wherein the second distance is a ¼ wavelength multiple of a second center frequency in the second frequency range.

12. The bias tee of claim 10, wherein the second distance is configured to provide an open circuit impedance at a second center frequency in the second frequency range.

13. The bias tee of claim 9, further comprising a third resonator coupled to the transmission line a third distance from the first node, where the third distance is greater than the second distance, the third resonator configured to block RF signals in a third frequency range, and wherein the third frequency range is a higher than the second frequency range.

14. The bias tee of claim 13, wherein the third resonator comprises a third radial stub and wherein the first radial stub has a first radius, the second radial stub has a second radius, and the third radial stub has a third radius, and wherein the first radius is larger than the second radius, and the second radius is larger than the third radius.

15. The bias tee of claim 9, wherein the first resonator comprises a first radial stub, and wherein the second resonator comprises a second radial stub, and wherein the first radial stub has a first radius, and the second radial stub has a second radius, and wherein the first radius is larger than the second radius.

16. The bias tee of claim 9, wherein the transmission line comprises a microstrip.

17. A radio frequency (RF) amplifier comprising:
a first transistor having a first transistor input and a first transistor output;
a first bias tee coupled to first transistor input, the first bias tee comprising:
   a first direct current (DC) source:
   a first transmission line having a first node coupled to the first transistor input and a second node coupled to the first DC source;
   a first resonator coupled to the first transmission line a first distance from the first node, the first resonator configured to block RF signals in a first frequency range;
   a second resonator coupled to the first transmission line a second distance from the first node, where the second distance is greater than the first distance, the second resonator configured to block RF signals in a second frequency range, and wherein the second frequency range is higher than the first frequency range, and wherein the first frequency range has a first center frequency, and wherein the second frequency range has a second center frequency, and wherein the second center frequency is a harmonic of the first center frequency; and
   a first capacitor coupled to the first node; and;
a second bias tee coupled to first transistor output, the second bias tee comprising:
   a second direct current (DC) source:
   a second transmission line having a third node coupled to the first transistor output and a fourth node coupled to the second DC source;
   a third resonator coupled to the second transmission line a third distance from the third node, the third resonator configured to block RF signals in a third frequency range;
   a fourth resonator coupled to the second transmission line a fourth distance from the third node, where the fourth distance is greater than the third distance, the fourth resonator configured to block RF signals in a fourth frequency range, and wherein the fourth frequency range is higher than the third frequency range, and wherein the third frequency range has a third center frequency, and wherein the fourth frequency range has a fourth center frequency, and wherein the fourth center frequency is a harmonic of the third center frequency; and
   a second capacitor coupled to the third node.

18. The RF amplifier of claim 17 wherein the first transistor comprises a field effect transistor and, wherein the first transistor input comprises a gate and wherein the first transistor output comprises a drain.

19. The RF amplifier of claim 17 wherein the first bias tee further comprises a fifth resonator coupled to the first transmission line a fifth distance from the first node, where the fifth distance is greater than the second distance, the fifth resonator configured to block RF signals in a fifth frequency range, and wherein the fifth frequency range is a higher than the second frequency range; and wherein the second bias tee further comprises a sixth resonator coupled to the second transmission line a sixth distance from the third node, where the sixth distance is greater than the fourth distance, the sixth resonator configured to block RF signals in a sixth frequency range, and wherein the sixth frequency range is a higher than the fourth frequency range.

20. The RF amplifier of claim 17 wherein the first distance is a ¼ wavelength multiple of a first center frequency in the first frequency range, and wherein the third distance is a ¼ wavelength multiple of a third center frequency in the third frequency range.

* * * * *